US011011412B2

(12) United States Patent
Shi et al.

(10) Patent No.: US 11,011,412 B2
(45) Date of Patent: May 18, 2021

(54) SEMICONDUCTOR STRUCTURE AND METHOD FOR THE FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Wei Shi, Shanghai (CN); Youcun Hu, Shanghai (CN); Xiamei Tang, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/556,743

(22) Filed: Aug. 30, 2019

(65) Prior Publication Data
US 2020/0411366 A1 Dec. 31, 2020

(30) Foreign Application Priority Data
Jun. 28, 2019 (CN) .......................... 201910579468.3

(51) Int. Cl.
H01L 23/58 (2006.01)
H01L 21/768 (2006.01)
(Continued)

(52) U.S. Cl.
CPC .... H01L 21/76802 (2013.01); H01L 21/0228 (2013.01); H01L 21/0337 (2013.01);
(Continued)

(58) Field of Classification Search
CPC .......... H01L 27/76802; H01L 21/0228; H01L 21/0337; H01L 21/31116; H01L 21/31144; H01L 21/76829
See application file for complete search history.

(56) References Cited

U.S. PATENT DOCUMENTS

2016/0064274 A1* 3/2016 Peng ................. H01L 21/76813
257/774
2016/0181103 A1* 6/2016 He ......................... H01L 29/02
257/632
2019/0103305 A1* 4/2019 Liu ................... H01L 21/76802

* cited by examiner

Primary Examiner — Victor A Mandala
Assistant Examiner — Colleen E Snow
(74) Attorney, Agent, or Firm — Brinks Gilson & Lione

(57) ABSTRACT

A semiconductor structure and a method for forming same are provided. In one form, a forming method includes: providing a base, where a core layer is formed on the base, a hard mask layer is formed on the core layer, and a first mask opening is formed in the hard mask layer; forming a first mask trench in the core layer exposed from the first mask opening, the first mask trench including a plurality of mask sub-trenches along an extending direction, where the mask sub-trenches are isolated from each other using the core layer exposed from the first mask opening; forming a first spacer on a side wall of the mask sub-trench; removing a core layer of a region in which the first mask opening is located, and forming, at a position corresponding to the core layer, a second mask trench enclosed by the first spacer and the base, the second mask trench and the first mask trench being isolated from each other using the first spacer; and forming a second spacer on a side wall of the second mask trench, where both the first spacer and the base, and the second spacer and the base, enclose a first target trench. The first spacer and the second spacer whose side walls contact with each other are used as a cutting member, alleviating rounding of a head of the first target trench.

19 Claims, 14 Drawing Sheets

(51) Int. Cl.
*H01L 21/033* (2006.01)
*H01L 21/311* (2006.01)
*H01L 21/02* (2006.01)

(52) U.S. Cl.
CPC .. *H01L 21/31116* (2013.01); *H01L 21/31144* (2013.01); *H01L 21/76829* (2013.01)

SEMICONDUCTOR STRUCTURE AND METHOD FOR THE FORMING SAME

RELATED APPLICATIONS

The present application claims priority to Chinese Patent Appln. No. 201910579468.3, filed Jun. 28, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With continuous development of integrated circuit manufacturing technologies, people impose increasingly high requirements on an integration level and performance of an integrated circuit. In order to increase an integration level and reduce costs, critical dimensions of parts and components become increasingly small, and a circuit density within the integrated circuit is increasingly large. Consequently, a wafer surface is incapable of providing a sufficient area to fabricate a required interconnecting wire due to such development.

In order to meet requirements of the interconnecting wire undergoing critical dimension reduction, currently, conduction between different metal layers or from a metal layer to a substrate is achieved using an interconnecting structure. As a technology node advances, a size of an interconnecting structure becomes increasingly small, and correspondingly, a process for forming the interconnecting structure is increasingly difficult. Quality of forming an interconnecting structure greatly impacts back end of line (BEOL) electrical performance and reliability of a device, and even affects normal operation of a semiconductor device in a severe case.

SUMMARY

A problem to be addressed by embodiments and implementations of the present disclosure is to provide a semiconductor structure and a method for the forming same, so as to improve performance of a transistor.

To address the foregoing problem, embodiments and implementations of the present disclosure provide a method for forming a semiconductor structure. In one form a method includes: providing a base, where a core layer is formed on the base, a hard mask layer is formed on the core layer, and a first mask opening is formed in the hard mask layer; forming a first mask trench in the core layer exposed from the first mask opening, along an extending direction of the first mask trench, where the first mask trench includes a plurality of mask sub-trenches, and the mask sub-trenches of the plurality of mask sub-trenches are isolated from each other using the core layer exposed from the first mask opening; forming a first spacer on a side wall of the mask sub-trench; removing a core layer of a region in which the first mask opening is located, and forming, at a position corresponding to the core layer, a second mask trench enclosed by the first spacer and the base, where the second mask trench and the first mask trench are isolated from each other using the first spacer; and forming a second spacer on a side wall of the second mask trench, after the second spacer is formed, where both the first spacer and the base, and the second space and the base, enclose a first target trench.

Embodiments and implementations of the present disclosure further provide a semiconductor structure. In one form, a semiconductor structure includes: a base; a core layer located on the base, where a mask trench group is formed in the core layer, along an extending direction of the mask trench group, the mask trench group including a first mask trench and a second mask trench, and where the first mask trench includes a plurality of isolated mask sub-trenches; a first spacer located on a side wall of the mask sub-trench, along the extending direction of the mask trench group, where the first spacer is adapted to enable the mask sub-trench and the second mask trench to be isolated from each other; a second spacer located on a side wall of the second mask trench, along the extending direction of the mask trench group, the second spacer covering a side wall of the first spacer, where both the first spacer and the base, and the second spacer and the base, enclose a first target trench; and a hard mask layer located on the core layer, a first mask opening being formed in the hard mask layer, the first mask opening being in a one-to-one correspondence with the mask trench group, and the first mask opening exposing the corresponding mask trench group.

Compared to the prior art, technical solutions of embodiments and implementations of the present disclosure have the following advantages:

In embodiments and implementations of the present disclosure, a core layer is formed on the base, and a hard mask layer having a first mask opening is formed on the core layer. Then, a first mask trench composed of a plurality of mask sub-trenches is formed in the core layer exposed from the first mask opening. After a first spacer is formed on the side wall of the mask sub-trench, the core layer of the region in which the first mask opening is located is removed. A second mask trench enclosed by the first spacer and the base is formed at a position corresponding to the core layer, and a second spacer is formed on the side wall of the second mask trench. Therefore, along the extending direction of the first mask opening, the side wall of first spacer and the side wall of the second spacer contact with each other, and the first spacer and the second spacer whose side walls contact with each other are used as a cutting member (cut feature) to cut off a pattern corresponding to first mask opening in the core layer, thereby forming, in the core layer, the first target trench formed by the first spacer and the base and that formed by the second spacer and the base.

Compared to a solution in which a pattern of the first mask opening is in a one-to-one correspondence with a pattern of the first target trench, along the extending direction of the first mask opening, widths of the first spacer and the second spacer are both less than a head-to-head distance between adjacent first target trenches. In addition, the first spacer and the second spacer are both formed using a process of a combination of deposition and etching. Therefore, the side walls of the first spacer and the second spacer have relatively high perpendicularities, helping alleviate rounding of a head of the first target trench, so that appearance quality and dimensional accuracy of the first target trench are improved, thereby improving performance of a transistor.

DETAILED DESCRIPTION

It is found through research that as technology nodes become increasingly small, a space between photoresist patterns also becomes increasing small. However, a photoresist pattern is prone to deform and distort under influence of a lithography process. When the photoresist pattern is transferred to a film layer to be patterned to form a target pattern (e.g. a target trench), pattern accuracy of the target pattern is reduced accordingly, resulting in performance degradation of a transistor.

Reasons for performance degradation of the transistor are now analyzed in combination with a method for forming a semiconductor structure.

FIG. 1 to FIG. 4 are schematic structural diagrams of steps in a method for forming a semiconductor structure.

Figure 1:
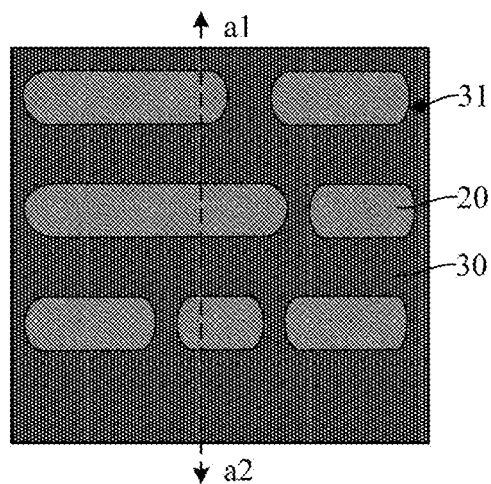
FIG. 1 to FIG. 4 are schematic structural diagrams of steps in a method for forming a semiconductor structure.
Figure 2:
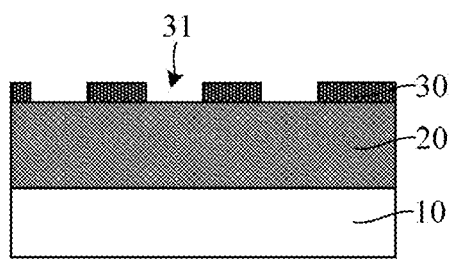

Referring to FIG. 1 and FIG. 2, FIG. 1 is a top view, and FIG. 2 is a cross-sectional view of FIG. 1 taken along a secant line a1a2. A base 10 is provided, where a core (mandrel) layer 20 is formed on the base 10, a hard mask (HM) layer 30 is formed on the core layer 20, and a mask opening 31 is formed in the hard mask layer 30.

The mask opening 31 is configured to define a shape, a position, and a size of a target trench subsequently formed in the core layer 20. The mask opening 31 is formed in the hard mask layer 30 using a photolithography process and an etching process that are sequentially performed.

Figure 3:
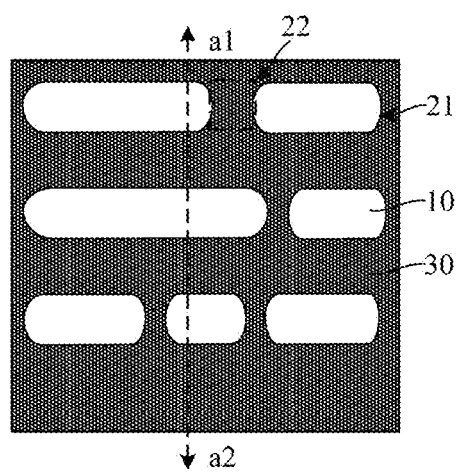
Figure 4:
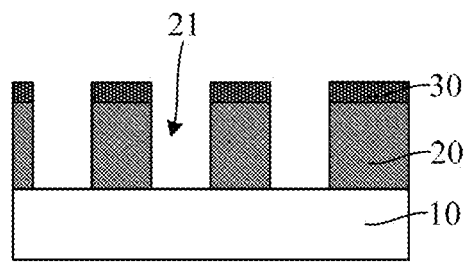

With reference to and referring to FIG. 3 and FIG. 4, FIG. 3 is a top view based on FIG. 1, and FIG. 4 is a cross-sectional view of FIG. 3 taken along a secant line a1a2. The core layer 20 exposed from the mask opening 31 is etched using the hard mask layer 30 as a mask, to form a target trench 21 in the core layer 20.

As shown in FIG. 3, along an extending direction of the target trench 21, the core layer 20 between heads of adjacent target trenches 21 is used as a cutting member 22, to isolate the adjacent target trenches 21.

Since the mask opening 31 (shown in FIG. 1) defines the shape, the position, and the size of the target trench 21, and the mask opening 31 is formed in the hard mask layer 30 using the photolithography process and the etching process that are sequentially performed, in the forming method, a cutting position between the adjacent target trenches 21 is directly defined using the hard mask layer 30.

However, along an extending direction of the mask opening 31, a critical dimension (CD) of a head of the mask opening 31 is relatively small. Therefore, rounding is likely to occur at a head of the mask opening 31 under influence of the photolithography process. After a pattern of the mask opening 31 is transferred to the core layer 20 to form the target trench 21, along the extending direction of the target trench 21, rounding also occurs at the head of the target trench 21. Rounding further results in a reduction in dimensional accuracy of the target trench 21.

A subsequent manufacture procedure generally further includes: etching the base 10 exposed from the target trench 21 using the hard mask layer 30 as a mask, and forming a target opening in the base 10.

Correspondingly, along an extending direction of the target opening, rounding also occurs at a head of the target opening, resulting in a reduction in appearance quality and dimensional accuracy of the target opening, and further adversely affecting performance of a transistor.

For example, when the base 10 includes a substrate (not shown) and a dielectric layer (not shown) located on the substrate, the target opening is formed in the dielectric layer, and the target opening is configured to provide a spatial position for forming a metal interconnecting wire subsequently. Reduction in the appearance quality and the dimensional accuracy of the target opening correspondingly reduces quality of forming the metal interconnecting wire, affecting performance of the metal interconnecting wire, and further adversely affecting performance of a transistor.

In order to address technical problems such as those described above, in embodiments and implementations of the present disclosure, the core layer is formed on the base, and the hard mask layer having a first mask opening is formed on the core layer. Then, a first mask trench composed of a plurality of mask sub-trenches is formed in the core layer exposed from the first mask opening. After a first spacer is formed on a side wall of the mask sub-trench, a core layer of a region in which the first mask opening is located is removed. A second mask trench enclosed by the first spacer and the base is formed at a position corresponding to the core layer. Then, a second spacer is formed on a side wall of a second mask trench. Therefore, along an extending direction of the first mask opening, the side wall of first spacer and the side wall of the second spacer contact with each other, and the first spacer and the spacer whose side walls contact with each other are used as a cutting member to cut off a pattern corresponding to first mask opening in the core layer, thereby forming, in the core layer, the first target trench formed by the first spacer and the base and that formed by the second spacer and the base.

Compared to a solution in which a pattern of the first mask opening is in a one-to-one correspondence with a pattern of the first target trench, along the extending direction of the first mask opening, widths of the first spacer and the second spacer are both less than a head-to-head distance between adjacent first target trenches. In addition, the first spacer and the second spacer are both formed using a process of a combination of deposition and etching. Therefore, the side walls of the first spacer and the second spacer have relatively high perpendicularities, helping alleviate rounding of the head of the first target trench, so that the appearance quality and the dimensional accuracy of the first target trench are improved, thereby improving performance of a transistor.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 5 to FIG. 45 are schematic structural diagrams of steps in one form of a method for forming a semiconductor structure according to the present disclosure.

Figure 5:
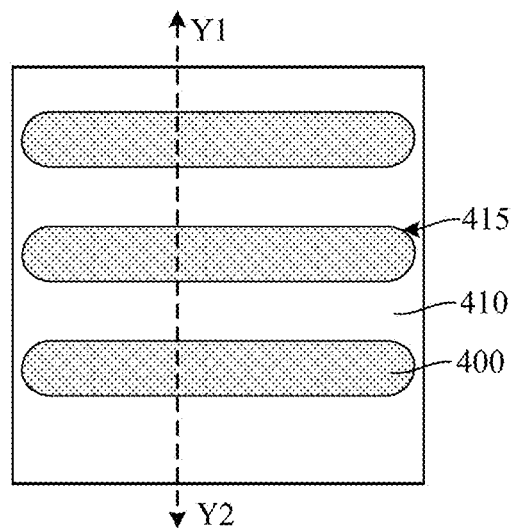
FIG. 5 to FIG. 45 are schematic structural diagrams of steps in one form of a method for forming a semiconductor structure according to the present disclosure.
Figure 6:
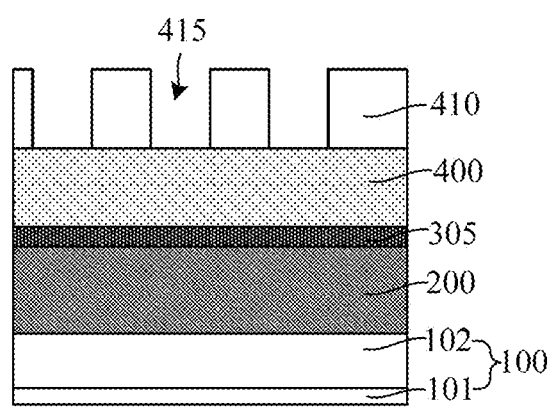
Figure 7:
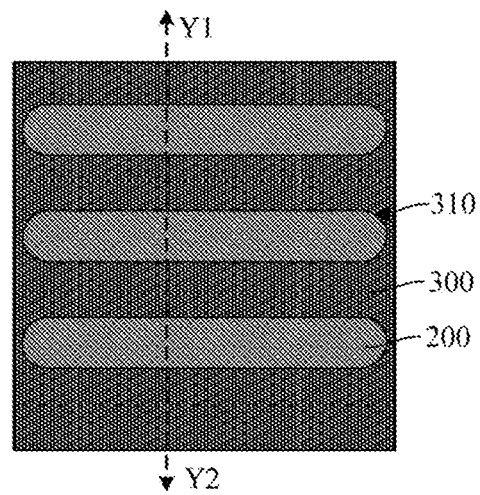
Figure 8:
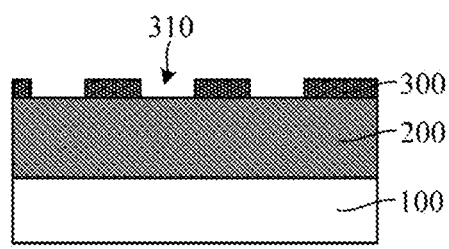

Referring to FIG. 5 to FIG. 8, FIG. 5 is a top view, FIG. 6 is a cross-sectional view of FIG. 5 taken along a secant line Y1Y2, FIG. 7 is a top view based on FIG. 5, and FIG. 8 is a cross-sectional view of FIG. 7 taken along a secant line Y1Y2. A base 100 is provided, a core layer 200 being formed on the base 100, a hard mask layer 300 (shown in FIG. 8) being formed on the core layer 200, and a first mask opening 310 (shown in FIG. 7) being formed in the hard mask layer 300.

The base 100 is configured to provide a process platform for a subsequent manufacture procedure. In some implementations, for example, a formed semiconductor structure is a planar transistor. The base 100 includes a substrate 101 (shown in FIG. 6).

In particular, the substrate 101 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In other implementations, when the formed semiconductor structure is a fin field effect transistor, the base may correspondingly include a substrate and a fin protruding from the substrate.

The base 100 may further include other structures, such as a gate structure, a doped region, a shallow trench isolation (STI) structure, a contact plug, and a dielectric layer, etc. The gate structure may be a metal gate structure or a polysilicon gate structure.

In some implementations, the base 100 further includes a dielectric layer 102 (shown in FIG. 6) formed on the substrate 101.

The dielectric layer 102 is configured to implement electrical isolation between subsequently formed interconnecting structures.

In some implementations, the dielectric layer 102 is an inter-metal dielectric (IMD) layer, and the dielectric layer 102 is configured to implement electrical isolation between metal interconnecting structures in a back end of line manufacture procedure.

In particular, for example, the dielectric layer 102 is a first inter-metal dielectric layer. The dielectric layer 102 is configured to implement electrical isolation between first metal interconnecting wires (that is, an M1 layer). The first metal interconnecting wire refers to a metal interconnecting structure closest to a contact plug.

For this purpose, the dielectric layer 102 is made of a low-k dielectric material (a low-k dielectric material refers to a dielectric material having a relative dielectric constant greater than or equal to 2.6 and less than or equal to 3.9), an ultra-low-k dielectric material (an ultra-low-k dielectric material refers to a dielectric material having a relative dielectric constant less than 2.6), silicon oxide, silicon nitride, or silicon oxynitride, etc.

In some implementations, the dielectric layer 102 is made of an ultra-low-k dielectric material, so that a parasitic capacitance between back end of line metal interconnecting structures is reduced, thereby reducing a back end of line RC delay. In particular, the ultra-low-k dielectric material may be SiOCH.

It should be noted that, for ease of illustration, the substrate 101 and the dielectric layer 102 are illustrated only in FIG. 6, and in subsequent cross-sectional views, the base 100 is not distinguished.

The core layer 200 is configured to transfer a pattern, so that a target opening is formed in the base 100, and a layout, a shape, and a size of the target opening are likely to meet process requirements through performing of manufacture procedures of various processes on the core layer 200.

The core layer 200 is also removed subsequently. Therefore, the core layer 200 is a material that is easily removed, and a process for removing the core layer 200 has relatively few damages to the base 100. In some implementations, the core layer 200 is made of amorphous silicon. Amorphous silicon is a core layer material frequently used in the semiconductor field. In other implementations, the core layer may also be made of amorphous carbon, amorphous germanium or amorphous silicon germanium.

The hard mask layer 300 is used as a mask for patterning the core layer 200 and the base 100.

The hard mask layer 300 is made of one or more of titanium oxide, titanium nitride, silicon oxide, silicon nitride, silicon oxynitride, and silicon carbide.

In some implementations, the dielectric layer 102 is an inter-metal dielectric layer. Therefore, the hard mask layer 300 is a metal hard mask (MHM) material layer. In particular, the hard mask layer 300 is made of titanium nitride. Titanium nitride is a metal hard mask layer material frequently used in a back end of line manufacture procedure.

In particular, a step of forming the hard mask layer 300 includes: with reference to and referring to FIG. 5 and FIG. 6, forming a hard mask material layer 305 on the core layer 200; forming a bottom anti-reflective coating (BAC) layer 400 on the hard mask material layer 305; and forming a first photoresist layer 410 on the first bottom anti-reflective coating layer 400, a first pattern opening 415 exposing a portion of the first bottom anti-reflective coating layer 400 being formed in the first photoresist layer 410; and with reference to and referring to FIG. 7 and FIG. 8, sequentially etching the first bottom anti-reflective coating layer 400 and the hard mask material layer 305 along the first pattern opening 415 using the first photoresist layer 410 as a mask, a remaining hard mask material layer 305 after etching being used as the hard mask layer 300.

The first bottom anti-reflective coating layer 400 is configured to reduce a reflection effect during exposure, so that transfer precision of a pattern is improved, thereby improving appearance quality and dimensional accuracy of the first pattern opening 415. In particular, the first bottom anti-reflective coating layer 400 may be a spin on carbon (SOC) layer.

During etching of the first bottom anti-reflective coating layer 400 along the first pattern opening 415, an etching selection ratio of a BARC material and photoresist is relatively small. Therefore, loss is caused to the first photoresist layer 410.

In some implementations, after the hard mask layer 300 is formed, only the first bottom anti-reflective coating layer 400 remains on the hard mask layer 300. Correspondingly, the forming method further includes: removing the first bottom anti-reflective coating layer 400. In particular, the first bottom anti-reflective coating layer 400 is removed using an ashing process.

In other implementations, when the first photoresist layer remains on the first bottom anti-reflective coating, the forming method further includes: removing the first photoresist layer and the first bottom anti-reflective coating layer.

Referring to FIG. 9 to FIG. 14, a first mask trench 210 (shown in FIG. 13) is formed in the core layer 200 exposed from the first mask opening 310 (shown in FIG. 7), along an extending direction of the first mask trench 210, the first mask trench 210 including a plurality of mask sub-trenches 211 (shown in FIG. 13), and the sub-trenches of the plurality of mask sub-trenches 211 are isolated from each other using the core layer 200 exposed from the first mask opening 310.

The first mask trench 210 is configured to provide a process basis for subsequently forming a target opening in the base 100. Moreover, the first mask opening 310 is configured to prepare for the subsequent forming a first spacer, and the core layer 200 exposed from the first mask opening 310 is configured to prepare for subsequently forming a second spacer.

The step of forming the first mask trench 210 is described in detail below with reference to the accompanying drawings.

Figure 9:
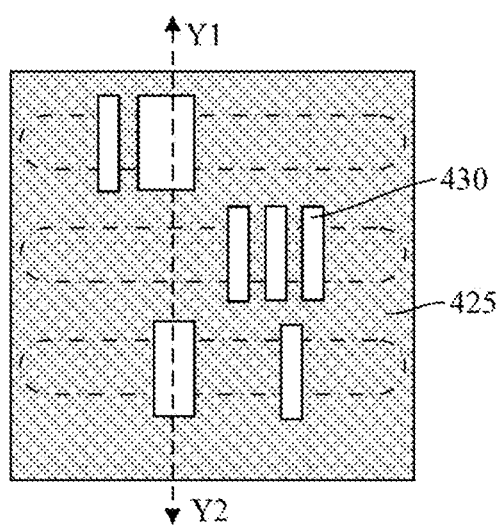
Figure 10:
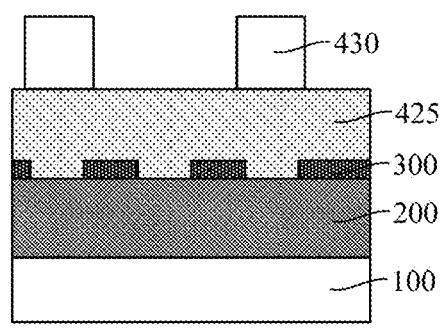
Figure 11:
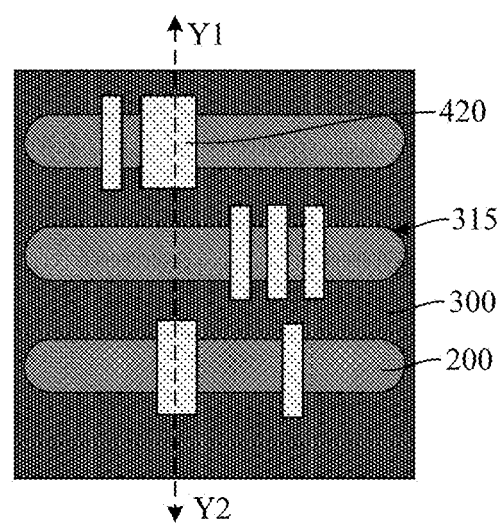
Figure 12:
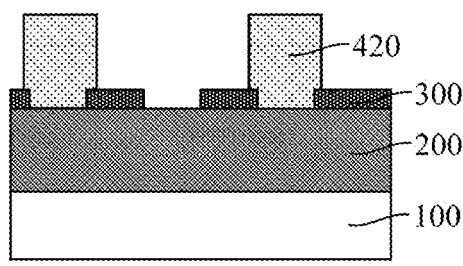

Referring to FIG. 9 to FIG. 12, FIG. 9 is a top view based on FIG. 7, FIG. 10 is a cross-sectional view of FIG. 9 taken along a secant line Y1Y2, FIG. 11 is a top view based on FIG. 9, and FIG. 12 is a cross-section of FIG. 11 taken along a secant line Y1Y2. A first protective layer 420 (shown in FIG. 11) covering a portion of a bottom of the first mask opening 310 (shown in FIG. 7) is formed, the first protective layer 420 being adapted to separate the first mask opening 310 into a plurality of isolated mask sub-openings 315 (shown in FIG. 11) along an extending direction of the first mask opening 310.

The first protective layer 420 serves as a cutting member, and the first protective layer 420 is formed to cut off a pattern corresponding to the first mask opening 310 in the core layer 200.

Compared to a solution in which a pattern of the first mask opening is in a one-to-one correspondence with a pattern of the mask sub-trench, the first protective layer 420 is used as a cutting member. Therefore, along the extending direction of the first mask opening 310, a side wall of the mask sub-trench 211 corresponding to a side wall of the first protective layer 420 has a relatively high perpendicularity, helping improve perpendicularities of subsequent first spacer and second spacer.

In some implementations, in a direction perpendicular to the extending direction of the first mask opening 310, a length of the first protective layer 420 is greater than a width of the first mask opening 310, that is, the first protective layer 420 spans the first mask opening 310 and covers a portion of hard mask layers 300 on both sides of the first mask opening 310.

The length of the first protective layer 420 is larger than the width of the first mask opening 310 to improve an effect of shielding, by the first protective layer 420, the portion of the bottom of the first mask opening 310, helping improve appearance quality and dimensional accuracy of the mask sub-opening 315, while helping further improve a perpendicularity of the side wall the first protective layer 420 along the extending direction of the first mask opening 310, thereby further improving the perpendicularity of the corresponding side wall of the mask sub-trench 211.

The first protective layer 420 is formed using a patterning process. Therefore, in order to reduce process complexity and reduce process costs, the first protective layer 420 is made of a BARC material, thereby being compatible with a photolithography process. For specific description of the BARC material, refer to the foregoing corresponding description of the first bottom anti-reflective coating layer 400 (shown in FIG. 6), and details are not described herein again.

In some implementations, the step of forming the first protective layer 420 includes: referring to FIG. 9 and FIG. 10, forming a first protective material layer 425 covering the hard mask layer 300 and the core layer 200; forming a second photoresist layer 430 on the first protective material layer 425, the second photoresist layer 430 spanning the first mask opening 310 (shown in FIG. 7); and referring to FIG. 11 and FIG. 12, etching the first protective material layer 425 using the second photoresist layer 430 (shown in FIG. 9) as a mask, where a remainder of the first protective material layer 425 is used as the first protective layer 420.

It should be noted that, for ease of illustration, an outline of the first mask opening 310 is illustrated using dashed lines in FIG. 9.

In some implementations, the second photoresist layer 43 is used as a mask to pattern the first protective material layer 425, so as to define a position, formation, and a size of the first protective layer 420. Therefore, in the direction perpendicular to the extending direction of the first mask opening 310, a length of the second photoresist layer 430 is greater than the width of the first mask opening 310.

In some implementations, the first protective material layer 425 is etched using a dry etching process. The dry etching process has an anisotropic etching characteristic, helping improve appearance quality of the side wall of the first protective layer 420, thereby improving a pattern transfer effect in a subsequent manufacture procedure.

It should be further noted that, the etching selection ratio of a BARC material and photoresist is relatively small. Therefore, loss is caused to the second photoresist layer 410. In some implementations, after the first protective layer 420 is formed, the second photoresist layer 430 is removed.

Figure 13:
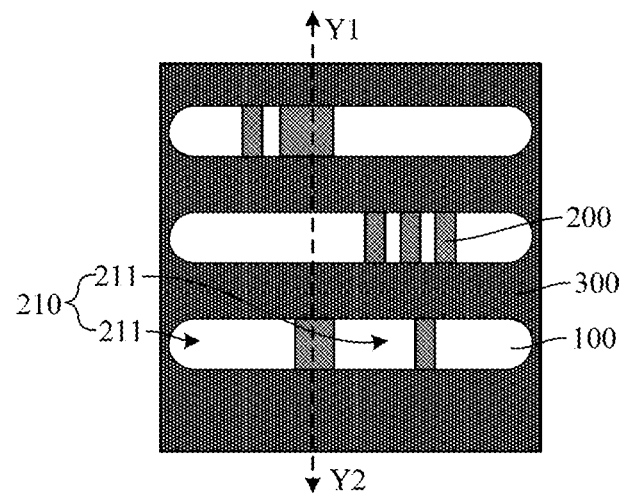
Figure 14:
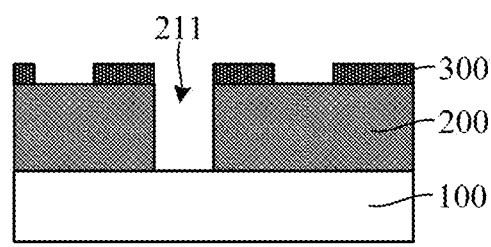

Referring to FIG. 13 to FIG. 14, FIG. 13 is a top view based on FIG. 11, and FIG. 14 is a cross-sectional view of FIG. 13 taken along a secant line Y1Y2. The core layer 200 is etched using the hard mask layer 300 and the first protective layer 420 (shown in FIG. 11) as a mask, to form a plurality of mask sub-trenches 211, where the plurality of mask sub-trenches 211 is arranged along the extending direction of the first mask opening 310 (shown in FIG. 7) forming the first target trench 210.

The plurality of mask sub-trenches 211 is configured to provide a process basis for forming a first spacer subsequently, and is configured to provide a process basis for forming a first target trench in the core layer 200 subsequently.

In some implementations, sizes of mask sub-trenches 211 parallel to a surface of the base 100 and along the extending direction of the first mask opening 310 are different from each other. Some mask sub-trenches 211 are configured to define a position of the first target trench formed in the core layer 200, and some mask sub-trenches 211 are configured to implement isolation between adjacent first target trenches.

Therefore, the sizes of the mask sub-trenches 211 parallel to the surface of the base 100 and along the extending direction of the first mask opening 310 are determined according to a layout and a size of a subsequently formed first target trench, a thickness of the first spacer, and a head-to-head distance between the adjacent first target trenches.

In some implementations, a first spacer is subsequently formed on side walls of the plurality of mask sub-trenches 211. Therefore, sizes of some mask sub-trenches 211 along a direction parallel to the surface of the base 100 are less than or equal to a half of a thickness of the first spacer, so that the first spacer can be filled in a partial region of the mask sub-trench 211. The first spacer filled in the mask sub-trench 211 is used as a cutting member to further implement isolation between the adjacent first target trenches.

In some implementations, the core layer 200 is etched using a dry etching process, and the first mask trench 210 is formed in the core layer 200 exposed from the first mask opening 310. The dry etching process has an anisotropic etching characteristic, so that appearance quality of the side wall of the mask sub-trench 211, thereby improving a pattern transfer effect in a subsequent manufacture procedure.

In some implementations, after the first mask trench 210 is formed, the method further includes: removing the first protective layer 420. In particular, the first protective layer 420 is removed using an ashing process.

Figure 15:
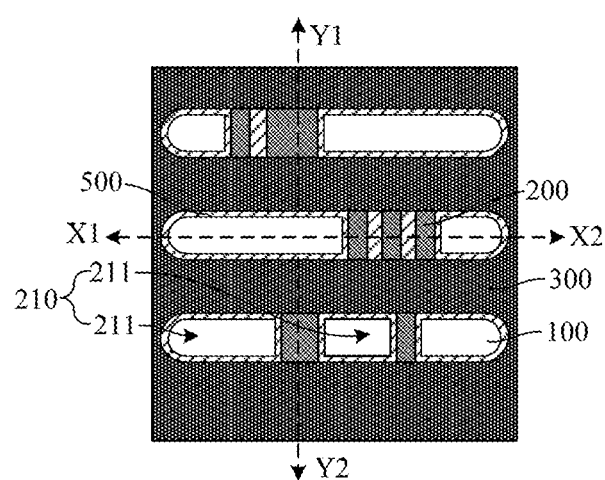
Figure 16:
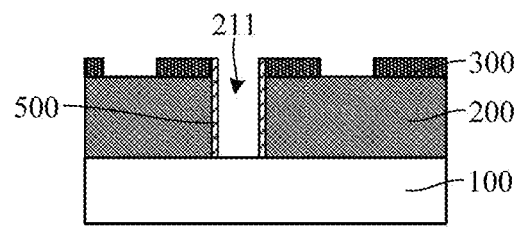
Figure 17:
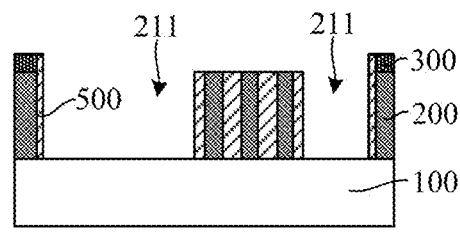

With reference to and referring to FIG. 15 to FIG. 17, FIG. 15 is a top view based on FIG. 13, FIG. 16 is a cross-sectional view of FIG. 15 taken along a secant line Y1Y2, and FIG. 17 is a cross-sectional view of FIG. 15 taken along a secant line X1X2. A first spacer 500 is formed on the side wall of the mask sub-trench 211.

The first spacer 500 is configured to provide a process basis for forming a second spacer subsequently.

Moreover, in the step of etching the base 100 subsequently, the first spacer 500 can further function as an etching mask.

In addition, along the extending direction of the first mask opening 310 (shown in FIG. 7), the first spacer 500 on the side wall of the mask sub-trench 211 is used as a cutting member, so that isolated first target trenches are formed in the core layer 200. Correspondingly, after the base 100 exposed from the first mask trench 210 is etched using the first spacer 500 and the hard mask layer 300 as a mask, the first spacer 500 is configured to cut off a pattern corresponding to the first mask opening 310 in the base 100, so that a plurality of isolated target openings is formed in the base 100.

In particular, the step of forming the first spacer 500 includes: forming a first spacer film, the first spacer film conformally covering the side wall and a bottom of the mask sub-trench 211 and a top and the side wall of the hard mask layer 300; etching the first spacer film along a direction perpendicular to the surface of the base 100 using a maskless dry etching process to retain a remainder of the first spacer film on the side wall of the mask sub-trench 211 as the first spacer 500.

In some implementations, the first spacer film is formed using an atom layer deposition process. The first spacer film is deposited in a form of an atomic layer using an atomic layer deposition process. The atomic layer deposition process has a good step coverage capability and a good gap filling capability, and can be used to form a film material with good thickness uniformity, helping improve forming quality and thickness uniformity of the first spacer film and improve a filling effect of the first spacer film in some mask sub-trenches 211.

In some implementations, etching is performed using a maskless dry etching process, so that not only a first spacer film at the bottom of the mask sub-trench 211 and the top of the hard mask layer 300 can be removed, but also the first spacer film on the side wall of the mask sub-trench 211 can be retained.

It should be noted that the first spacer film further conformally covers the side wall of the hard mask layer 300. However, a depth of the first mask opening 310 is much smaller than that of the mask sub-trench 211. Therefore, during etching of the first spacer film, the first spacer film on the side wall of the first mask opening 310 can be removed.

In some implementations, sizes of mask sub-trenches 211 parallel to a surface of the base 100 and along the extending direction of the first mask opening 310 are different from each other.

A partial region of the first spacer 500 is filled in the corresponding mask sub-trench 211 according to process requirements. In particular, sizes of some mask sub-trenches 211 along the direction parallel to the surface of the base 100 are less than or equal to a half of the thickness value of the first spacer 500. During forming of the first spacer film, as a thickness of deposited materials increases, first spacer films on the side wall of the mask sub-trench 211 finally contact with each other, thereby filling the corresponding mask sub-trench 211.

Correspondingly, sizes of some mask sub-trenches 211 are relatively large. The first spacer 500 covers only a side wall of the corresponding mask sub-trench 211, and the first spacer 500 exposes a portion of a bottom of the corresponding mask sub-trench 211.

In other implementations, the first spacer may also expose a portion of the bottom of the corresponding mask sub-trench.

In some implementations, along the extending direction of the first mask opening 310, a side wall of a core layer 200 between adjacent mask sub-trenches 211 has a relatively high perpendicularity, and the first spacer 500 is formed using a process of a combination of deposition and etching. Therefore, the side wall of the first spacer 500 has a relatively high perpendicularity.

The first spacer 500 is made of one or more of titanium oxide, titanium nitride, silicon oxide, silicon nitride, silicon oxynitride, and silicon carbide.

The first spacer 500 is made of a material different from those of the core layer 200 and the base 100. Therefore, in the steps of etching the core layer 200 and the base 100, the first spacer 500 is not easily removed, so that the first spacer 500 functions as an etching mask.

It should be further noted that a subsequent manufacture procedure further includes a step of etching the hard mask layer 300, and in the step of etching the hard mask layer 300, the first spacer 500 functions as an etching mask. Therefore, in the step of etching the hard mask layer 300, there is a relatively high etching selection ratio between the hard mask layer 300 and the first spacer 500.

In some implementations, the first spacer 500 is made of a material different from that of the hard mask layer 300, and the first spacer 500 is made of titanium oxide. There is a relatively high etching selection ratio between titanium nitride and titanium oxide.

Referring to FIG. 18 to FIG. 26, a core layer 200 of a region in which the first mask opening 310 (shown in FIG. 7) is located is removed, and a second mask trench 220 (shown in FIG. 24) enclosed by the first spacer 500 and the base 100 is formed at a position corresponding to the core layer 200, the second mask trench 220 and the first mask trench 210 (shown in FIG. 15) being isolated from each other using the first spacer 500.

The second mask trench 220 is configured to provide a process basis for forming a second spacer subsequently, and is configured to provide a process basis for forming a first target trench in the core layer 200 subsequently.

Along the extending direction of the first mask opening 310, the side wall of the core layer 200 between the adjacent mask sub-trenches 211 (shown in FIG. 13) has a relatively high perpendicularity, and the side wall of the first spacer 500 also has a relatively high perpendicularity. Therefore, a side wall of the second mask trench 220 also has a relatively high perpendicularity.

In some implementations, sizes of second mask trenches 220 parallel to a surface of the base 100 and along the extending direction of the first mask opening 310 are different from each other. Some second mask trenches 220 are configured to define a position of the first target trench formed in the core layer 200, and some second mask trenches 220 are configured to implement isolation between adjacent first target trenches.

Therefore, the sizes of the second mask trenches 220 parallel to the surface of the base 100 and along the extending direction of the first mask opening 310 are determined according to a layout and a size of a subsequently formed first target trench, a thickness of the second spacer, and a head-to-head distance between the adjacent first target trenches.

In some implementations, a second spacer is formed on the side wall of the second mask trench 220 subsequently. Therefore, sizes of some second mask trenches 220 along a direction parallel to the surface of the base 100 are less than or equal to a half of a thickness of the second spacer, so that the second spacer can be filled in a partial region of the second mask trench 220. The second spacer filled in the second mask trench 220 is also used as a cutting member to further implement isolation between the adjacent first target trenches.

In other implementations, sizes of all the second mask trenches may be less than or equal to a half of the thickness of the second spacer, or the sizes of all the second mask trenches may be greater than or equal to a half of the thickness of the second spacer.

The step of forming the second mask trench 220 is described in detail below with reference to the accompanying drawings.

Figure 18:
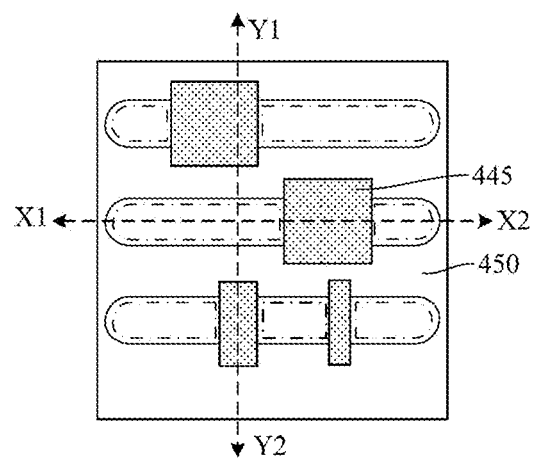
Figure 19:
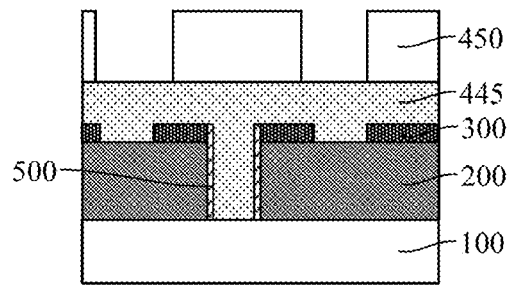
Figure 20:
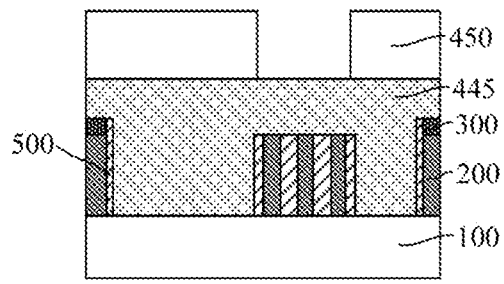
Figure 21:
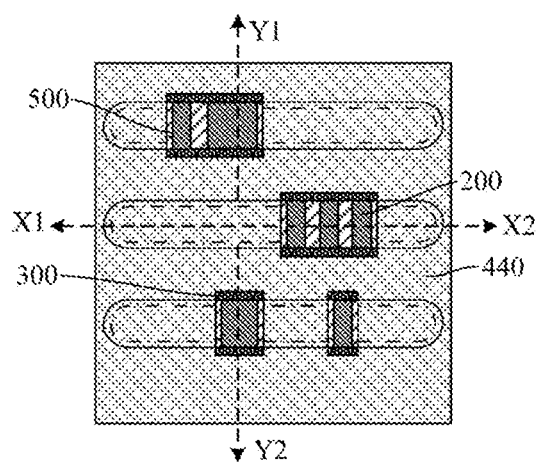
Figure 22:
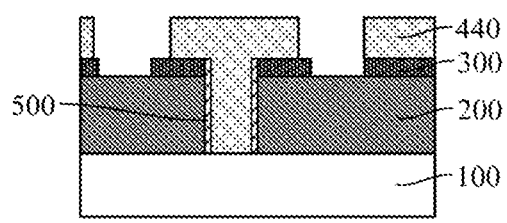
Figure 23:
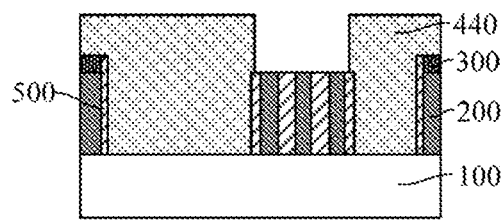

Referring to FIG. 18 to FIG. 23, FIG. 18 is a top view based on FIG. 15, FIG. 19 is a cross-sectional view of FIG. 18 taken along a secant line Y1Y2, FIG. 20 is a cross-sectional view of FIG. 18 taken along a secant line X1X2, FIG. 21 is a top view based on FIG. 18, FIG. 22 is a cross-sectional view of FIG. 21 taken along a secant line Y1Y2, and FIG. 23 is a cross-sectional view of FIG. 21 taken along a secant line X1X2. A second protective layer 440 (shown in FIG. 21) is formed on the hard mask layer 300, the second protective layer 440 being filled in the first mask trench 210 (shown in FIG. 15), and the second protective layer 440 exposing the core layer 200 of the region in which the first mask opening 310 (shown in FIG. 7) is located.

A subsequent manufacture procedure further includes removing the core layer 200 of the region in which the first mask opening 310 is located, where the second protective layer 440 is configured to protect the base 100 exposed from the first mask trench 210, so that a damage caused to the base 100 is reduced.

The second protective layer 440 is formed using a patterning process. Therefore, in order to reduce process complexity and reduce process costs, the second protective layer 440 is made of a BARC material, thereby being compatible with a photolithography process. For a specific description of the BARC material, refer to the foregoing corresponding description of the first bottom anti-reflective coating layer 400 (shown in FIG. 6), and details are not described herein again.

In some implementations, the step of forming the second protective layer 440 includes: referring to FIG. 18 to FIG. 20, forming a second protective material layer 445 covering the hard mask layer 300, the first spacer 500, and the core layer 200, the second protective material layer 445 being further filled in the first mask trench 210 (shown in FIG. 15); forming a third photoresist layer 450 on the second protective material layer 445, the third photoresist layer 450 exposing the second protective material layer 445 above the core layer 200 of the region in which the first mask opening 310 is located; etching the second protective material layer 445 using the third photoresist layer 450 as a mask to form the second protective layer 440; and referring to FIG. 21 to FIG. 23, etching the second protective material layer 445 using the third photoresist layer 440 as a mask, where a remainder of the protective material layer 445 is used as the second protective layer 440.

It should be noted that, for ease of illustration, in FIG. 18 and FIG. 21, an outline of the mask sub-trench 211 (shown in FIG. 15) is illustrated using solid lines, and an outline of the first spacer 500 (shown in FIG. 15) is illustrated using dashed lines.

In some implementations, a first spacer 500 is formed on the side wall of the core layer 200 of the region in which the first mask opening 310 is located, and a hard mask layer 300 is formed on a top of the core layer 200. Under action of the first spacer 500 and the hard mask layer 300, a process window of the photolithography process for forming the second protective layer 440 is increased. For example, the second protective layer 440 not only exposes the core layer 200 of the region in which the first mask opening 310 is located, but can also exposes the first spacer 500 on the side wall of the core layer 200 and a portion of hard mask layer 300 on the top of the core layer 200.

In some implementations, the second protective material layer 445 is etched using a dry etching process. The dry etching process has an anisotropic etching characteristic, helping improve appearance quality of the side wall of the first protective layer 420, thereby improving a pattern transfer effect in a subsequent manufacture procedure.

It should be further noted that, the etching selection ratio of a BARC material to photoresist is relatively small. Therefore, loss is caused to the third photoresist layer 450. In some implementations, after the second protective layer 440 is formed, the third photoresist layer 450 is removed.

Figure 24:
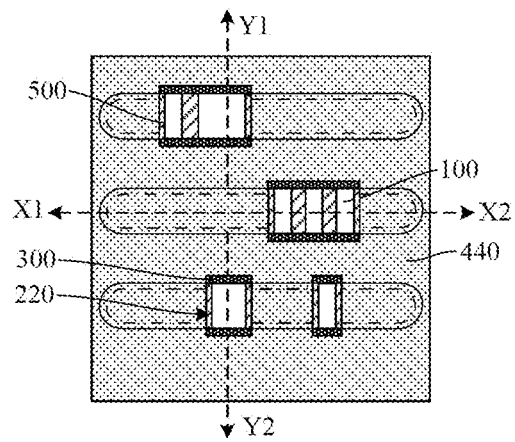
Figure 25:
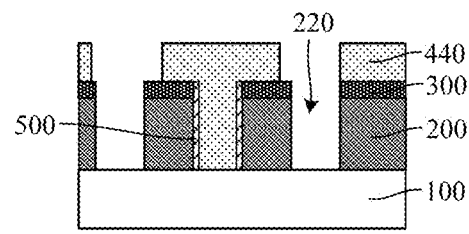
Figure 26:
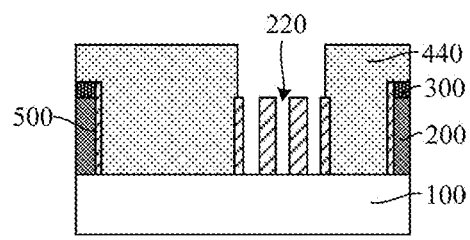

With reference to and referring to FIG. 24 to FIG. 26, FIG. 24 is a top view based on FIG. 21, FIG. 25 is a cross-sectional view of FIG. 24 taken along a secant line Y1Y2, and FIG. 26 is a cross-sectional view of FIG. 24 taken along a secant line X1X2. The exposed core layer 200 is removed using the second protective layer 440 as a mask to form the second mask trench 220.

In some implementations, the core layer 200 is etched using a dry etching process. The dry etching process has an anisotropic etching characteristic, helping improve appearance quality of the side wall of the second mask trench 220, thereby improving a pattern transfer effect in a subsequent manufacture procedure.

In some implementations, after the second mask trench 220 is formed, the second protective layer 440 is retained.

A subsequent manufacture procedure further includes: forming a second spacer on the side wall of the second mask trench 220. The second protective layer 440 is retained, so that the second protective layer 440 can protect the first mask trench 210 (shown in FIG. 15), thereby preventing the second spacer from being formed on the side wall of the first spacer 500 in the mask sub-trench 211 (shown in FIG. 15).

In some implementations, after the second mask trench 220 is formed, the second mask trench 220 and the first mask trench 210 arranged along the extending direction of the first mask opening 310 (shown in FIG. 7) constitute a mask trench group (not labeled). There is a plurality of mask trench groups, where the mask trench groups of the plurality of mask trench groups are arranged in parallel.

Figure 28:
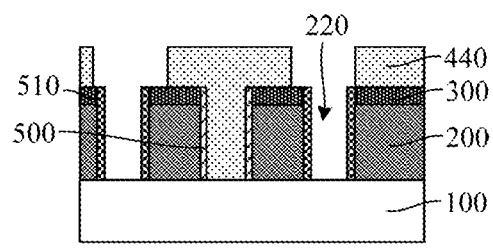
Figure 29:
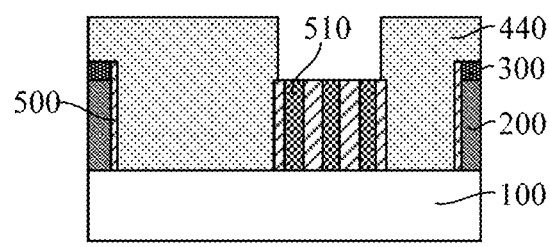
Figure 30:
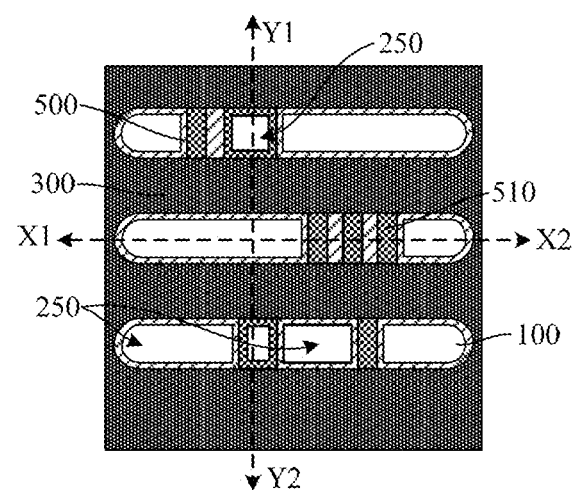

With reference to and referring to FIG. 27 to FIG. 32, a second spacer 510 (shown in FIG. 27) is formed on the side wall of the second mask trench 220, and after the second spacer 510 is formed, both the first spacer 500 and the base 100, and the second spacer 510 and the base 100 enclose a first target trench 250 (shown in FIG. 30).

In the step of etching the base 100 subsequently, the second spacer 510 can function as an etching mask. Moreover, along the extending direction of the first mask opening 310 (shown in FIG. 7), the second spacer 510 is used as a cutting member, so that isolated first target trenches are formed in the core layer 200.

In some implementations, along the extending direction of the first mask opening 310, the side wall of the second mask trench 220 has a relatively high perpendicularity, and the second spacer 510 is formed using a process of a combination of deposition and etching. Therefore, the side wall of the second spacer 510 has a relatively high perpendicularity.

Along the extending direction of the first mask opening 310, the side wall of first spacer 500 and the side wall of the second spacer 510 contact with each other, and the first spacer 500 and the second spacer 510 whose side walls contact with each other are used as a cutting member to cut off a pattern corresponding to first mask opening 310 in the core layer 200, thereby forming, in the core layer 200, the first target trench 250 formed by the first spacer 500 and the base 100 and that formed by the second spacer 510 and the base 100. Compared to a solution in which a pattern of the first mask opening is in a one-to-one correspondence with a pattern of the first target trench, along the extending direction of the first mask opening 310, widths of the first spacer 500 and the second spacer 510 are both less than a head-to-head distance between adjacent first target trenches 250. In addition, the first spacer 500 and the second spacer 510 are both formed using a process of a combination of deposition and etching. Therefore, the side walls of the first spacer 500 and the second spacer 510 have relatively high perpendicularities, helping alleviate rounding of the head of the first target trench 250, so that the appearance quality and the dimensional accuracy of the first target trench 250 are improved, thereby improving performance of a transistor.

After the base 100 is etched using the second spacer 510, the first spacer 500, and the hard mask layer 300 as a mask, the second spacer 510 is also configured to cut off the pattern corresponding to the first mask opening 310 in the base 100, so that a plurality of isolated target openings are formed in the base 100, and the target opening also has relatively high appearance quality and dimensional accuracy.

Figure 27:
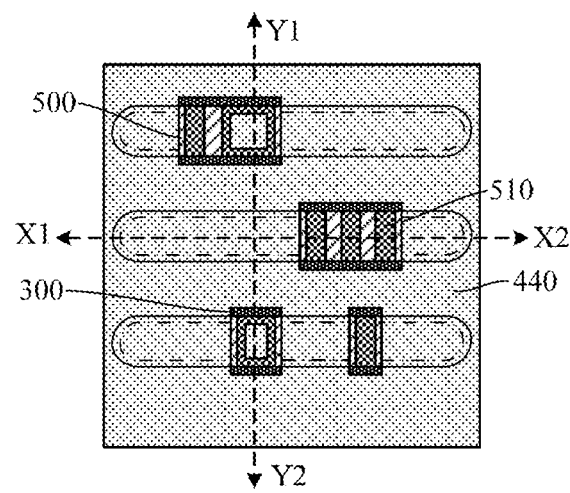

In particular, referring to FIG. 27 to FIG. 29, FIG. 27 is a top view based on FIG. 24, FIG. 28 is a cross-sectional view of FIG. 27 taken along a secant line Y1Y2, and FIG. 29 is a cross-sectional view of FIG. 27 taken along a secant line X1X2. The step of forming the second spacer 510 includes: forming a second spacer film, the second spacer film conformally covering the side wall and a bottom of the second mask trench 220 and a top and a side wall of the second protective layer 440; etching the second spacer film along the direction perpendicular to the surface of the base 100 using a maskless dry etching process to retain a remainder of the second spacer film on the side wall of the second mask trench 220 as the second spacer 510.

In some implementations, the second spacer film is formed using an atom layer deposition process. The second spacer film is deposited in a form of an atomic layer using an atomic layer deposition process. The atomic layer deposition process has a good step coverage capability and a good gap filling capability, and can be used to form a film material with good thickness uniformity, helping improve forming quality and thickness uniformity of the second spacer film and improve a filling effect of the second spacer film in a portion of the second mask trench 220.

In some implementations, etching is performed using a maskless dry etching process, so that not only a second spacer film at the bottom of the second mask trench 220 and the top of the second protective layer 440 can be removed, but also the second spacer film on the side wall of the second mask trench 220 can be retained.

Correspondingly, the second spacer 510 is further formed on the side wall of the second protective layer 440.

It should be noted that the second spacer film further conformally covers the side wall of the second protective layer 440. However, during forming of the second mask trench 220 using an etching process, loss is also caused to the second protective layer 440, and the thickness of the second protective layer 440 is much smaller than that of the second mask trench 220.

Therefore, during etching of the second spacer film, the second spacer film on the side wall of the second protective layer 440 may also be removed.

In some implementations, sizes of second mask trenches 220 parallel to the surface of the base 100 and along the extending direction of the first mask opening 310 are different from each other, and according to a head-to-head distance between adjacent first target trenches, a partial region of the second spacer 510 is filled in the corresponding second mask trench 220, the partial region of the second spacer 510 exposing a portion of a bottom of the corresponding second mask trench 220.

In other implementations, all the second spacer may be filled in the corresponding second mask trench, or all the second spacer exposes a portion of the bottom of the corresponding second mask trench.

The second spacer 510 is made of at least one of titanium oxide, titanium nitride, silicon oxide, silicon nitride, silicon oxynitride, or silicon carbide, so that the second spacer 510 can function as an etching film in the step of etching the base 100 subsequently.

It should be noted that a subsequent manufacture procedure further includes a step of etching the hard mask layer 300, and in the step of etching the hard mask layer 300, the second spacer 510 functions as an etching mask. Therefore, in the step of etching the hard mask layer 300, there is a relatively high etching selection ratio between the hard mask layer 300 and the second spacer 510.

In some implementations, the second spacer 510 is made of a material different from that of the hard mask layer 300, and the second spacer 510 is made of titanium oxide. There is a relatively high etching selection ratio between titanium nitride and titanium oxide.

Moreover, the side wall of the second spacer 510 is in contact with the side wall of the first spacer 500, and the second spacer 510 is made of a material same as that of the first spacer 500. This helps improve adhesion between the side wall of the second spacer 510 and the first spacer 500, thereby improving process stability.

Figure 31:
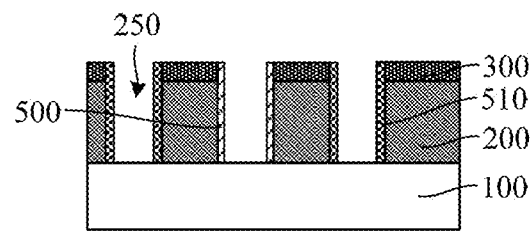
Figure 32:
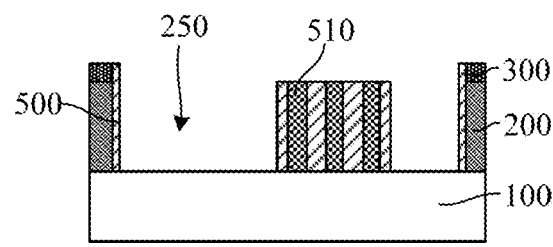

With reference to and referring to FIG. 30 to FIG. 32, FIG. 30 is a top view based on FIG. 27, FIG. 31 is a cross-sectional view of FIG. 30 taken along a secant line Y1Y2, and FIG. 32 is a cross-sectional view of FIG. 30 taken along a secant line X1X2. After the second spacer 510 is formed, the method further includes: removing the second protective layer 440 (shown in FIG. 27).

In some implementations, the second protective layer 440 is made of a BARC material. Therefore, the second protective layer 440 is removed using an ashing process.

Figure 37:
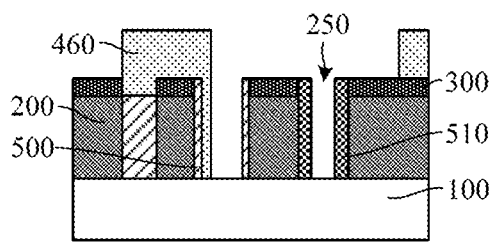
Figure 38:
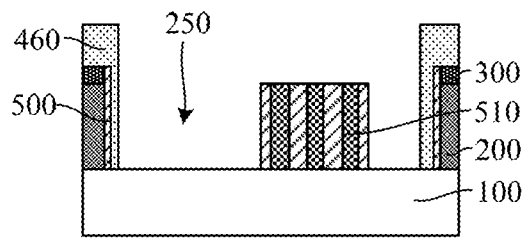
Figure 39:
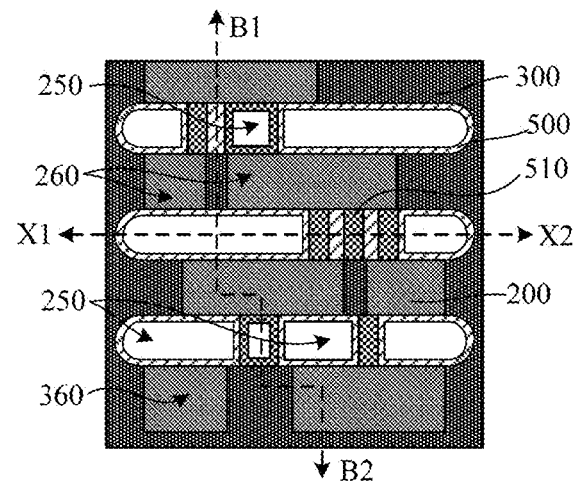

With reference to and referring to FIG. 33 to FIG. 44, after the first target trench 250 (shown in FIG. 30) is formed, the forming method further includes: along a direction perpendicular to the extending direction of the first mask opening 310 (shown in FIG. 7), patterning a hard mask layer 300 between the adjacent first target trenches 250 to form, in the hard mask layer 300, a second mask opening 360 exposing a portion of the core layer 200 (shown in FIG. 39).

The second mask opening 360 is configured to define a position, a shape, and a size of a second target trench subsequently formed in the core layer 200.

In particular, the second mask trench 220 and the first mask trench 210 arranged along the extending direction of the first mask opening 310 constitute a mask trench group (not labeled). Therefore, the hard mask layer 300 between the adjacent mask trench groups is patterned to form the second mask opening 360.

The step of forming the second mask opening 360 is described in detail below with reference to the accompanying drawings.

Figure 33:
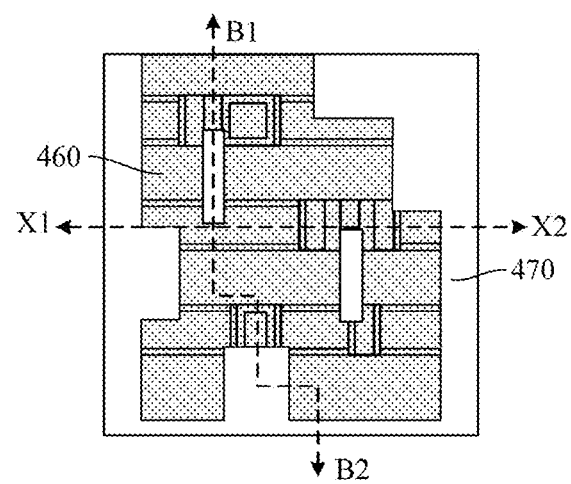
Figure 34:
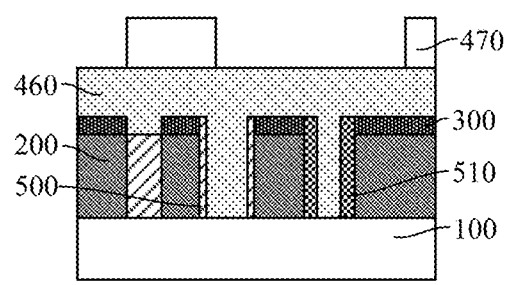
Figure 35:
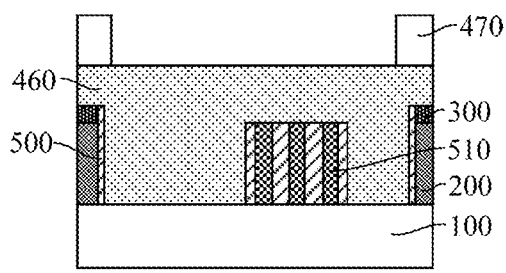

With reference to and referring to FIG. 33 to FIG. 35, FIG. 33 is a top view based on FIG. 30, FIG. 34 is a cross-sectional view of FIG. 33 taken along a secant line B1B2, and FIG. 35 is a cross-sectional view of FIG. 33 taken along a secant line X1X2. A second bottom anti-reflective coating layer 460 covering the hard mask layer 300, the first spacer 500, and the second spacer 510 is formed, the second bottom anti-reflective coating layer 460 being further filled in the first target trench 250 (shown in FIG. 30). A fourth photoresist layer 470 is formed on the second bottom anti-reflective coating layer 460, the fourth photoresist layer 470 exposing a second bottom anti-reflective coating layer 460 above a to-be-etched hard mask layer 300.

In some implementations, the position of the second target trench is directly defined using the fourth photoresist layer 470, and a head-to-head distance between second target trenches meets process requirements.

For specific description of the second bottom anti-reflective coating layer 460, refer to the foregoing corresponding description of the first bottom anti-reflective coating layer 400 (shown in FIG. 6), and details are not described herein again.

In some implementations, since the first spacer 500 and the second spacer 510 are made of materials different from that of the hard mask layer 300, relatively little loss is caused to the first spacer 500 and the second spacer 510 in a subsequent process of patterning the hard mask layer 300. Correspondingly, the fourth photoresist layer 470 not only exposes the second bottom anti-reflective coating layer 460 above the to-be-etched hard mask layer 300, but also can expose a second bottom anti-reflective coating layer 460 above the first target trench 250, the first spacer 500, and the second spacer 510, thereby significantly increasing a process window of the lithography process.

Figure 36:
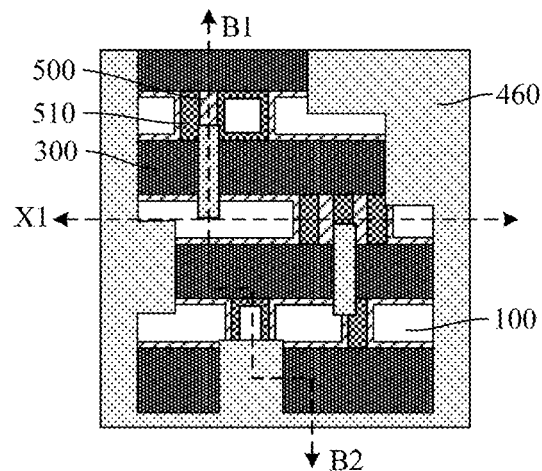

Referring to FIG. 36 to FIG. 38, FIG. 36 is a top view based on FIG. 33, FIG. 37 is a cross-sectional view of FIG. 36 taken along a secant line B1B2, and FIG. 38 is a cross-sectional view of FIG. 36 taken along a secant line X1X2. The second bottom anti-reflective coating layer 460 is etched using the fourth photoresist layer 470 as a mask.

After the second bottom anti-reflective coating layer 460 is etched, the to-be-etched hard mask layer 300 is exposed, thereby preparing for etching the hard mask layer 300 subsequently.

In some implementations, the fourth photoresist layer 470 further exposes the second bottom anti-reflective coating layer 460 above the first target trench 250, the first spacer 500, and the second spacer 510. After the second bottom anti-reflective coating layer 460 is etched, a remaining second bottom anti-reflective coating layer 460 further exposes the first target trench 250, the first spacer 500, and the second spacer 510.

It should be noted that, since the first spacer 500 and the second spacer 510 are made of materials different from that of the hard mask layer 300, even if the first spacer 500 and the second spacer 510 are exposed in a process environment of the patterning the hard mask layer 300, relatively little loss is caused to the first spacer 500 and the second spacer 510 in the process of patterning the hard mask layer 300.

It should be further noted that, the etching selection ratio of a BARC material to photoresist is relatively small. Therefore, loss is caused to the fourth photoresist layer 470. In some implementations, after the second bottom anti-reflective coating layer 460 is etched, the fourth photoresist layer 470 is removed.

Figure 40:
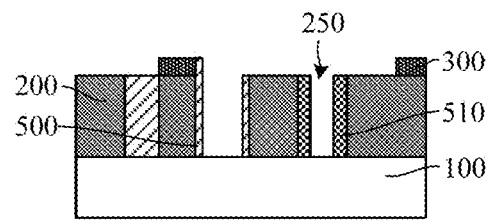
Figure 41:
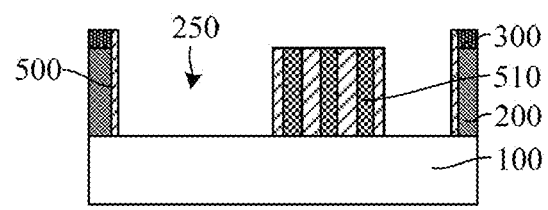

With reference to and referring to FIG. 39 to FIG. 41, FIG. 39 is a top view based on FIG. 36, FIG. 40 is a cross-sectional view of FIG. 39 taken along a secant line B1B2, and FIG. 41 is a cross-sectional view of FIG. 39 taken along a secant line X1X2. The hard mask layer 300 exposed from the remainder of the second bottom anti-reflective coating layer 460 is etched.

In some implementations, the hard mask layer 300 is etched using a dry etching process, and a second mask opening 360 is formed in the hard mask layer 300. The dry etching process has an anisotropic etching characteristic, helping improve appearance quality of the side wall of the second mask opening 360, thereby improving a pattern transfer effect in a subsequent manufacture procedure.

In some implementations, after the second mask opening 360 is formed, the method further includes: removing the remainder of the second bottom anti-reflective coating layer 460.

In particular, the remainder of the second bottom anti-reflective coating layer 460 is removed using an ashing process.

Figure 42:
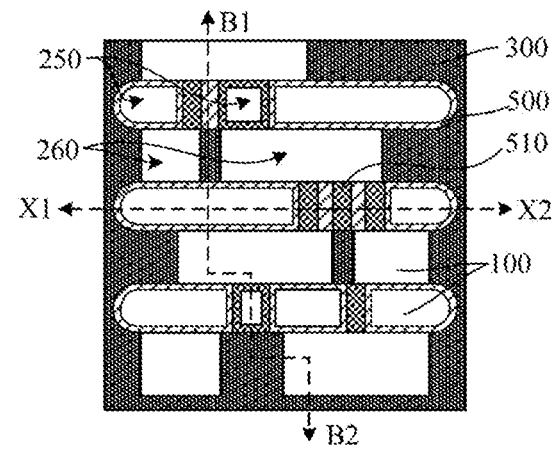
Figure 43:
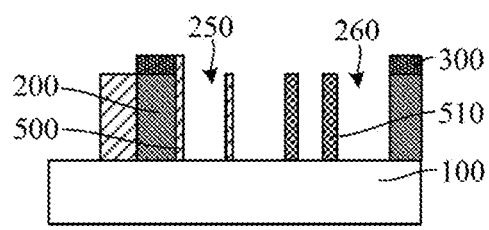
Figure 44:
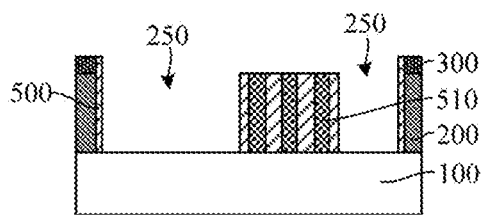

With reference to and referring to FIG. 42 to FIG. 44, FIG. 42 is a top view based on FIG. 39, FIG. 43 is a cross-sectional view of FIG. 42 taken along a secant line B1B2, and FIG. 44 is a cross-sectional view of FIG. 42 taken along a secant line X1X2. The core layer 200 exposed from the second mask opening 360 (shown in FIG. 39) is removed using the first spacer 500, the second spacer 510, and a remainder of the hard mask layer 300 as a mask to form a second target trench 260 in the core layer 200 (shown in FIG. 42).

The first target trench 250 and the second target trench 260 are respectively formed, so that the process window of the photolithography process is improved. For example, limitation on a resolution of the photolithography process is alleviated, so that pattern accuracy of both the first target trench 250 and the second target trench 260 is improved. Correspondingly, after bases 100 exposed from the first target trench 250 and the second target trench 260 is subsequently etched to form a target opening, pattern precision of the target opening is improved correspondingly.

Moreover, during forming of the second target trench 260, the first spacer 500 and the second spacer 510 are used as a mask, and there is a relatively large etching selection ratio both between the core layer 200 and the first spacer 500 and between the core layer 200 and the second spacer 510. This significantly improves the process window for forming the second target trench 260, preventing the first target trench 250 and the second target trench 260 from being connected. In addition, a space between adjacent first target trench 250 and second target trench 260 is likely to meet a designed minimum space, and pattern accuracy of the second target trench 260 is ensured.

Correspondingly, the first target trench 250 and the second target trench 260 are isolated using the first spacer 500 and the second spacer 510.

In some implementations, a first spacer 500 is formed on the side wall of the mask sub-trench 211 (shown in FIG. 15), a second spacer 510 is formed on the side wall of the second mask trench 220 (shown in FIG. 24), and the first spacer 500, the second spacer 510, and the remaining hard mask layer 300 cover a portion of the core layer 200 that is not desired to be etched. Therefore, under protection of the first spacer 500, the second spacer 510, and the remaining hard mask layer 300, the core layer 200 exposed from the second mask opening 360 can be removed using a wet etching process. The process is simple and an effect of removing the core layer 200 is good.

Moreover, in the wet etching process, there is a relatively high etching selection ratio between the core layer 200 and the first spacer 500, between the core layer 200 and the second spacer 510, as well as between the core layer 200 and the hard mask layer 300. The wet etching process is performed through chemical reaction, helping to reduce a damage caused to the first spacer 500, the second spacer 510, and the hard mask layer 300, thereby ensuring appearance quality of the first target trench 250 and the second target trench 260, and preventing the first target trench 250 and the second target trench 260 from being connected.

Figure 45:
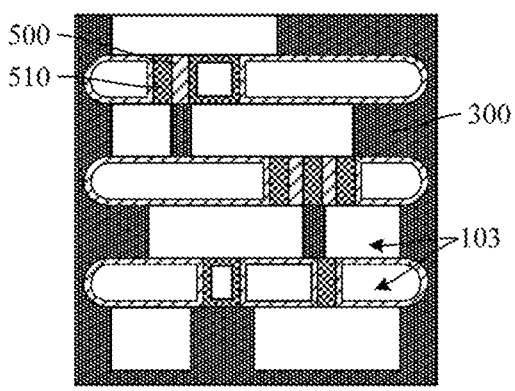

With reference to and referring to FIG. 45, FIG. 45 is a top view based on FIG. 42, and the method further includes: etching, using the hard mask layer 300, the first spacer 500, and the second spacer 510 as a mask, the base 100 (shown in FIG. 6) exposed from the target trench 250 (shown in FIG. 42), to form a target opening 103 in the base 100.

The target opening 103 is configured to provide a spatial position for forming a functional structure subsequently.

In forms of the foregoing forming method, rounding of the head of the first target trench 250 is alleviated, correspondingly improving the appearance quality and the dimensional accuracy of the target opening 103, thereby improving performance of a transistor.

In some implementations, etching is performed using a dry etching process to further improve the appearance quality of the first target trench 103.

In particular, the step of patterning the base 100 includes: patterning the dielectric layer 102 (shown in FIG. 6) to form the first target trench 103 in the dielectric layer 102. Correspondingly, the first target trench 103 is configured to provide a spatial position for forming an interconnecting structure subsequently.

In some implementations, the step of forming the target opening 103 in the base 100 further includes: further etching the base 100 exposed from the second target trench 260 in the step of etching the base 100 exposed from the first target trench 250.

A subsequent step further includes: forming an interconnecting structure in the target opening 103. The appearance quality and the dimensional accuracy of the target opening 103 are relatively high, so that appearance and a layout of the interconnecting structure meet design requirements, thereby improving performance of the interconnecting structure correspondingly.

In some implementations, the dielectric layer 102 is an inter-metal dielectric layer. Therefore, the interconnecting structure is a metal interconnecting wire in a back end of line manufacture procedure. For example, the metal interconnecting wire is a first metal (M1) interconnecting wire.

As a circuit integration degree increases, a design of a back end of line metal interconnecting wire is increasingly complicated, and a space between adjacent metal interconnecting wires is increasingly small. In the foregoing method, quality of the metal interconnecting wire is improved, thereby improving performance and reliability of a transistor.

In other implementations, when the dielectric layer is an interlayer dielectric layer, the interconnecting structure is a contact plug correspondingly.

Embodiments and implementations of the present disclosure further provide a semiconductor structure. Referring to FIG. 42 to FIG. 44, a schematic structural diagram of one form of a semiconductor structure according to the present disclosure is shown. FIG. 42 is a top view, FIG. 43 is a cross-sectional view of FIG. 42 taken along a secant line B1B2, and FIG. 44 is a cross-sectional view of FIG. 42 taken along a secant line X1X2.

The semiconductor structure includes: base 100; a core layer 200 located on the base 100, a mask trench group (not labeled) being formed in the core layer 200, along an extending direction of the mask trench group, the mask trench group including a first mask trench 210 (shown in FIG. 15) and a second mask trench 220 (shown in FIG. 24), and the first mask trench 210 including a plurality of isolated mask sub-trenches 211 (shown in FIG. 15); a first spacer 500 located on a side wall of the mask sub-trench 211, along the extending direction of the mask trench group, the first spacer 500 being adapted to enable the mask sub-trench 211 and the second mask trench 220 to be isolated from each other; a second spacer 510 located on a side wall of the second mask trench 220, along the extending direction of the mask trench group, the second spacer 510 covering a side wall of the first spacer 500, both the first spacer 500 and the base 100, and the second spacer 520 and the base 100 enclosing a first target trench 250; and a hard mask layer 300 located on the core layer 200, a first mask opening 310 (shown in FIG. 7) being formed in the hard mask layer 300, the first mask opening 310 being in a one-to-one correspondence with the mask trench group, and the first mask opening 310 exposing the corresponding mask trench group.

The first spacer 500 is located on the side wall of the mask sub-trench 211, and the second spacer 510 is located on the side wall of the second mask trench 220, both the first spacer 500 and the base 100, and the second spacer 520 and the base 100 enclosing the first target trench 250. Therefore, along the extending direction of the first mask opening 310, the side wall of the first spacer 500 and the side wall of the second spacer 510 contact with each other, and the first spacer 500 and the second spacer 510 whose side walls contact with each other are used as a cutting member to cut off a pattern corresponding to first mask opening 310 in the core layer 200, thereby obtaining a plurality of isolated first target trenches 250.

Compared to a solution in which a pattern of the first mask opening is in a one-to-one correspondence with a pattern of the first target trench, in some implementations, along the extending direction of the first mask opening 310, widths of the first spacer 500 and the second spacer 510 are both less than a head-to-head distance between adjacent first target trenches 250. In addition, the first spacer 500 and the second spacer 510 are both formed using a process of a combination of deposition and etching. Therefore, the side walls of the first spacer 500 and the second spacer 510 have relatively high perpendicularities, helping alleviate rounding of a head of the first target trench 250, and corresponding improving appearance quality and dimensional accuracy of the first target trench 250, thereby improving performance of a transistor.

In some implementations, for example, the semiconductor structure is a planar transistor. The base 100 includes a substrate 101 (shown in FIG. 6).

In particular, the substrate 101 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In other implementations, when the formed semiconductor structure is a fin field effect transistor, the base may correspondingly include a substrate and a fin protruding from the substrate.

The base 100 may further include other structures such as a gate structure, a doped region, a shallow trench isolation structure, a contact plug, and a dielectric layer, etc. The gate structure may be a metal gate structure or a polysilicon gate structure.

In some implementations, the base 100 further includes a dielectric layer 102 (shown in FIG. 6) located on the substrate 101.

The dielectric layer 102 is configured to implement electrical isolation between interconnecting structures.

In some implementations, the dielectric layer 102 is an inter-metal dielectric layer, and the dielectric layer 102 is configured to implement electrical isolation between metal interconnecting structures in a back end of line manufacture procedure.

In particular, for example, the dielectric layer 102 is a first inter-metal dielectric layer. The dielectric layer 102 is configured to implement electrical isolation between first metal interconnecting wires. The first metal interconnecting wire refers to a metal interconnecting structure closest to a contact plug.

In some implementations, the dielectric layer 102 is made of an ultra-low-k dielectric material, so that a parasitic capacitance between back end of line metal interconnecting structures is reduced, thereby reducing a back end of line RC delay. In particular, the ultra-low-k dielectric material may be SiOCH.

The mask trench group is formed through patterning of the core layer 200, and the hard mask layer 300 is used as a mask for patterning the core layer 200. The first mask opening 310 is configured to define a region in which the mask trench group is located.

Moreover, a manufacture procedure of forming a transistor generally includes: etching, using the hard mask layer 300, the first spacer 500, and the second spacer 510 as a mask, a base 100 exposed from the first target trench 250, to form a target opening in the base. Therefore, the hard mask layer 300 is also used as a mask for patterning the base 1000.

The hard mask layer 300 is made of one or more of titanium oxide, titanium nitride, silicon oxide, silicon nitride, silicon oxynitride, and silicon carbide.

In some implementations, the dielectric layer 102 is an inter-metal dielectric layer. Therefore, the hard mask layer 300 is a metal hard mask material layer. In particular, the hard mask layer 300 is made of titanium nitride. Titanium nitride is a metal hard mask layer material frequently used in a back end of line manufacture procedure.

The core layer 200 is configured to transfer a pattern, so that a pattern in the core layer 200 is transferred into the base 100, and a target opening is formed in the base 100, and a layout, a shape, and a size of the target opening are likely to meet process requirements through performing of manufacture procedures of various processes on the core layer 200.

In some implementations, the core layer 200 is made of amorphous silicon. Amorphous silicon is a core layer material frequently used in the semiconductor field. In other implementations, the core layer may also be made of amorphous carbon, amorphous germanium or amorphous silicon germanium.

The first mask trench 210 and the second mask trench 220 are configured to provide a process basis for forming the first target trench 250.

In particular, the first mask trench 210 is configured to provide a process platform for forming the first spacer 500, and the second mask trench 220 is configured to provide a process platform for and prepare for forming the second spacer 510.

The first mask trench 210 includes a plurality of isolated mask sub-trenches 211.

In some implementations, sizes of mask sub-trenches 211 parallel to a surface of the base 100 and along the extending direction of the first mask opening 310 are different from each other. Some mask sub-trenches 211 are configured to define a position of the first target trench 250, and some mask sub-trenches 211 are configured to implement isolation between adjacent first target trenches 250.

Therefore, the sizes of the mask sub-trenches 211 parallel to the surface of the base 100 and along the extending direction of the first mask opening 310 are determined according to a layout and a size of the first target trench 250, a thickness of the first spacer 500, and a head-to-head distance between the adjacent first target trenches 250.

In some implementations, the first spacer 500 is located on the side wall of the mask sub-trench 211, along the extending direction of the mask trench group, the first spacer 500 being adapted to enable the mask sub-trench 211 and the second mask trench 220 to be isolated from each other.

Moreover, in the step of etching the base 100 subsequently, the first spacer 500 functions as an etching mask.

In addition, along the extending direction of the first mask opening 310, the first spacer 500 on the side wall of the mask sub-trench 211 is used as a cutting member, so that the first target trenches 250 are isolated from each other. Correspondingly, after the base 100 exposed from the first target trench 250 is etched using the first spacer 500 and the hard mask layer 300 as a mask, the first spacer 500 is configured to cut off a pattern corresponding to the first mask opening 310 in the base 100, so that a plurality of isolated target openings is formed in the base 100.

In some implementations, according to process requirements, the sizes of some mask sub-trenches 211 parallel to the surface of the base 100 and along the extending direction of the first mask opening 310 are less than or equal to a half of a thickness of the first spacer 500. Therefore, a partial region of the first spacer 500 is filled in the corresponding mask sub-trench 211, the partial region of the first spacer 500 exposing a portion of a bottom of the corresponding mask sub-trench 211.

In other implementations, the first spacer may also expose a portion of the bottom of the mask sub-trench.

The first spacer 500 is made of one or more of titanium oxide, titanium nitride, silicon oxide, silicon nitride, silicon oxynitride, and silicon carbide.

The first spacer 500 is made of a material different from those of the core layer 200 and the base 100. Therefore, in the steps of etching the core layer 200 and the base 100, the first spacer 500 is not easily removed, so that the first spacer 500 functions as an etching mask.

It should be noted that a manufacture procedure of forming the semiconductor structure includes a step of etching the hard mask layer 300 using the first spacer 500 as a mask. Therefore, in the step of etching the hard mask layer 300, there is a relatively high etching selection ratio between the hard mask layer 300 and the first spacer 500.

In some implementations, the first spacer 500 is made of a material different from that of the hard mask layer 300. Further, the first spacer 500 may be made of titanium oxide. There is a relatively high etching selection ratio between titanium nitride and titanium oxide.

In some implementations, sizes of second mask trenches 220 parallel to a surface of the base 100 and along the extending direction of the first mask opening 310 are different from each other. Some second mask trenches 220 are configured to define a position of the first target trench 250, and some second mask trenches 220 are configured to implement isolation between adjacent first target trenches 250.

Therefore, the sizes of the second mask trenches 220 parallel to the surface of the base 100 and along the extending direction of the first mask opening 310 are determined according to a layout and a size of the first target trench 250, a thickness of the second spacer 500, and a head-to-head distance between the adjacent first target trenches 250.

In the step of etching the base 100 subsequently, the second spacer 510 can function as an etching mask.

Moreover, parallel to the surface of the base 100 and along the extending direction of the first mask opening 310, the second spacer 510 covers the side wall of the first spacer 500. The second spacer 510 is also used as a cutting member to isolate first target trenches 250, thereby forming a plurality of isolated target openings in the base 100.

In some implementations, according to process requirements, the sizes of some second mask trenches 220 parallel to the surface of the base 100 and along the extending direction of the first mask opening 310 are less than or equal to a half of a thickness of the second spacer 510. Therefore, a partial region of the second spacer 510 is filled in the corresponding second mask trench 220, the partial region of the second spacer 510 exposing a portion of a bottom of the corresponding second mask trench 220.

In other implementations, all the second spacer may also be filled in the second mask trench, or all the second spacer exposes a portion of the bottom of the second mask trench.

The second spacer 510 is made of one or more of titanium oxide, titanium nitride, silicon oxide, silicon nitride, silicon oxynitride, and silicon carbide. The second spacer 510 is made of a material different from those of the core layer 200 and the base 100. Therefore, in the steps of etching the core layer 200 and the base 100, the second spacer 510 is not easily removed, so that the second spacer 510 functions as an etching mask.

It should be noted that a manufacture procedure of forming the semiconductor structure includes a step of etching the hard mask layer 300 using the second spacer 510 as a mask. Therefore, in the step of etching the hard mask layer 300, there is a relatively high etching selection ratio between the hard mask layer 300 and the second spacer 510.

In some implementations, the second spacer 510 is made of a material different from that of the hard mask layer 300, and the second spacer 510 is made of titanium oxide. There is a relatively high etching selection ratio between titanium nitride and titanium oxide.

In some implementations, the semiconductor structure further includes: a second target trench 260, along a direction perpendicular to an extending direction of the first mask opening 310, the second target trench 260 being located in a core layer 200 between the adjacent first target trenches 250, and the second target trench 260 and the first target trench 250 being isolated from each other using the first spacer 500 and the second spacer 510.

In particular, the second mask trench 220 and the first mask trench 210 arranged along the extending direction of the first mask opening 310 constitute a mask trench group (not labeled). Therefore, the second target trench 260 is located between the adjacent mask trench groups.

The first spacer 500 is located on the side wall of the mask sub-trench 211, the second spacer 510 is located on the side wall of the second mask trench 220, and the second target trench 260 and the first target trench 250 are isolated from each other using the first spacer 500 and the second spacer 510. Therefore, using the first spacer 500 and the second spacer 510, during a process of forming the semiconductor structure, the first target trench 250 and the second target trench 260 are formed in different process steps. This improves a process window of a photolithography process. For example, limitation on a resolution of the photolithography process is alleviated, so that pattern accuracy of both the first target trench 250 and the second target trench 260 is improved. Correspondingly, after bases 100 exposed from the first target trench 250 and the second target trench 260 are subsequently etched to form a target opening, pattern accuracy of the target opening is correspondingly improved, thereby improving performance of a transistor.

Moreover, during forming of the second target trench 260, the first spacer 500 and the second spacer 510 can be used as a mask, and there is a relatively large etching selection ratio both between the base 100 and the first spacer 500 and between the base 100 and the second spacer 510. This significantly improves a process window for forming the second target trench 260, preventing the first target trench 250 and the second target trench 260 from being connected. In addition, a space between adjacent first target trench 250 and second target trench 260 is likely to meet a designed minimum space, and pattern accuracy of the second target trench 260 is ensured.

Correspondingly, a second mask opening 360 (shown in FIG. 39) is formed in the hard mask layer 300, the second mask opening 360 being in a one-to-one correspondence with the second target trench 260, and the second mask opening 360 exposing the corresponding second target trench 260. The second mask opening 360 is configured to define a position, a shape, and a size of the second target trench 260.

The second mask opening 360 is formed through patterning of the hard mask layer 300. Since the first spacer 500 and the second spacer 510 are made of materials different from that of the hard mask layer 300, even if the first spacer 500 and second spacer 510 are exposed in a process environment of the patterning the hard mask layer 300, relatively few damages are caused to the first spacer 500 and the second spacer 510 in the process of patterning the hard mask layer 300. This significantly increases a process window for a photolithography process used to form the second mask opening 360.

The semiconductor structure in these implementations may be formed using forms of the forming method described above, or may be formed using other forming methods. For detailed descriptions of some implementations of the semiconductor structure, refer to the respective descriptions in the foregoing discussion.

Although embodiments and implementations of the present disclosure are described above, the present disclosure is not limited thereto. Various changes and modifications may be made by those skilled in the art without departing from the spirit and scope of the present disclosure, and thus the protection scope of the present disclosure should be subject to the scope defined by the claims.

What is claimed is:

1. A method for forming a semiconductor structure, comprising:
   providing a base, where a core layer is formed on the base, a hard mask layer is formed on the core layer, and a first mask opening is formed in the hard mask layer;
   forming a first mask trench in the core layer exposed from the first mask opening, along an extending direction of the first mask trench, where the first mask trench comprises a plurality of mask sub-trenches along the extending direction of the first mask trench, and the mask sub-trenches of the plurality of mask sub-trenches are isolated from each other using the core layer exposed from the first mask opening;
   forming a first spacer on a side wall of the mask sub-trench;
   removing a core layer of a region in which the first mask opening is located, and forming, at a position corresponding to the core layer, a second mask trench enclosed by the first spacer and the base, where the second mask trench and the first mask trench are isolated from each other using the first spacer;
   forming a second protective layer on the hard mask layer, the second protective layer being filled in the first mask trench, and the second protective layer exposing a core layer of the region in which the first mask opening is located;
   removing the exposed core layer using the second protective layer as a mask;
   forming a second spacer on a side wall of the second mask trench, after the second spacer is formed, both the first spacer and the base, and the second spacer and the base, enclose a first target trench; and
   after forming the second spacer, removing the second protective layer.

2. The method for forming a semiconductor structure according to claim 1, wherein the method further comprises: after the first target trench is formed:
   patterning a hard mask layer between the adjacent target trenches along a direction perpendicular to the extending direction of the first mask opening to form a second mask opening exposing a portion of the core layer in the hard mask layer; and
   removing the core layer exposed from the second mask opening using the first spacer, the second spacer, and a remainder of the hard mask layer as a mask, to form a second target trench in the core layer.

3. The method for forming a semiconductor structure according to claim 2, wherein the hard mask layer is made of a material different from those of the first mask spacer and the second mask spacer.

4. The method for forming a semiconductor structure according to claim 2, wherein the step of forming the second target trench comprises:
   removing the core layer exposed from the second mask opening using a wet etching process.

5. The method for forming a semiconductor structure according to claim 1, wherein the forming method further comprises:
   etching a base exposed from the first target trench using the hard mask layer, the first spacer, and the second spacer as a mask to form a target opening in the base.

6. The method for forming a semiconductor structure according to claim 5, wherein:
   the step of providing the base comprises: providing a substrate and a dielectric layer formed on the substrate; and
   the step of patterning the base comprises: patterning the dielectric layer to form the target opening in the dielectric layer, where the target opening is adapted to form an interconnecting structure.

7. The method for forming a semiconductor structure according to claim 6, wherein the dielectric layer is an inter-metal dielectric layer.

8. The method for forming a semiconductor structure according to claim 1, wherein:
   the step of forming the first mask trench comprises:
      forming a first protective layer covering a portion of a bottom of the first mask opening, the first protective layer being adapted to partition the first mask opening into a plurality of isolated mask sub-openings along the extending direction of the first mask opening; and
      etching the core layer using the hard mask layer and the first protective layer as a mask; and
   the forming method further comprises: removing the first protective layer.

9. The method for forming a semiconductor structure according to claim 8, wherein in the step of forming the first protective layer, along the direction perpendicular to the extending direction of the first mask opening, the first protective layer spans the first mask opening and covers a portion of hard mask layers on both sides of the first mask opening.

10. The method for forming a semiconductor structure according to claim 8, wherein the first protective layer is made of a BARC material.

11. The method for forming a semiconductor structure according to claim 1, wherein the step of forming the first spacer on the side wall of the mask sub-trench comprises:
    forming a first spacer film, where the first spacer film conformally covers a side wall and a bottom of the mask sub-trench and a top and a side wall of the hard mask layer; and
    etching the first spacer film along a direction perpendicular to a surface of the base using a maskless dry etching process to retain a remainder of the first spacer film on the side wall of the mask sub-trench as the first spacer.

12. The method for forming a semiconductor structure according to claim 1, wherein the step of forming the second spacer on the side wall of the second mask trench comprises:
    forming a second spacer film, the second spacer film conformally covering a side wall and a bottom of the second mask trench and a top and a side wall of the second protective layer; and
    etching the second spacer film along a direction perpendicular to a surface of the base using a maskless dry etching process to retain remainder of the second spacer film on the side wall of the second mask trench as the second spacer.

13. The method for forming a semiconductor structure according to claim 1, wherein in the step of forming the first spacer on the side wall of the mask sub-trench:
    the first spacer exposes a portion of a bottom of the mask sub-trench; or
    a partial region of the first spacer is filled in the corresponding mask sub-trench, where the partial region of the first spacer exposes a portion of a bottom of the corresponding mask sub-trench.

14. The method for forming a semiconductor structure according to claim 1, wherein in the step of forming the second spacer on the side wall of the second mask trench:
- the second spacer is filled in the corresponding second mask trench; or
- the second spacer exposes a portion of a bottom of the corresponding second mask trench; or
- a partial region of the second spacer is filled in the corresponding second mask trench, the partial region of the second spacer exposing a portion of a bottom of the corresponding second mask trench.

15. The method for forming a semiconductor structure according to claim 1, wherein the first mask trench is formed in the core layer exposed from the first mask opening using a dry etching process.

16. The method for forming a semiconductor structure according to claim 1, wherein the core layer of the region in which the first mask opening is located is removed using a dry etching process to form the second mask trench.

17. The method for forming a semiconductor structure according to claim 1, wherein the second protective layer is made of a BARC material.

18. The method for forming a semiconductor structure according to claim 1, wherein at least one of the hard mask layer, the first spacer, or the second spacer is made of at least one of titanium oxide, titanium nitride, silicon oxide, silicon nitride, silicon oxynitride, or silicon carbide.

19. The method for forming a semiconductor structure according to claim 1, wherein a process for forming at least one of the first spacer or the second spacer comprises an atomic layer deposition process.

\* \* \* \* \*